US00RE43840E

(19) United States
(12) Reissued Patent
Kataoka et al.

(10) Patent Number: US RE43,840 E
(45) Date of Reissued Patent: Dec. 4, 2012

(54) SILICON CARBIDE SEMICONDUCTOR DEVICE

(75) Inventors: Mitsuhiro Kataoka, Kariya (JP); Yuuichi Takeuchi, Kariya (JP); Masami Naito, Kariya (JP); Rajesh Kumar, Kariya (JP); Hiroyuki Matsunami, Yawata (JP); Tsunenobu Kimoto, Kyoto (JP)

(73) Assignee: DENSO CORPORATION, Kariya (JP)

(21) Appl. No.: 12/926,030

(22) Filed: Oct. 21, 2010

Related U.S. Patent Documents

Reissue of:
(64) Patent No.: 6,853,006
Issued: Feb. 8, 2005
Appl. No.: 10/630,978
Filed: Jul. 31, 2003

(30) Foreign Application Priority Data

Aug. 9, 2002 (JP) ..... 2002-233722

(51) Int. Cl.
*H01L 31/0312* (2006.01)
(52) U.S. Cl. ..... 257/77; 257/192; 257/288; 257/616
(58) Field of Classification Search ..... 257/77, 257/192, 288, 616
See application file for complete search history.

(56) References Cited

U.S. PATENT DOCUMENTS 5,736,753 A 4/1998 Ohno et al.

FOREIGN PATENT DOCUMENTS

| | | |
|---|---|---|
| JP | A-6-227886 | 8/1994 |
| JP | A-06-227886 | 8/1994 |
| JP | A-09-172187 | 6/1997 |
| JP | H09-172187 | 6/1997 |

OTHER PUBLICATIONS

Office Action dated Aug. 31, 2007 from the Japan Patent Office in the corresponding patent application No. 2002-233722 (and English translation).
Office Action dated Dec. 17, 2004 from the Chinese Patent Office in the corresponding patent application No. 031525903 (and English translation).
Office Action dated Aug. 4, 2010 from the German Patent Office in the corresponding patent application No. 103 34 819.0 (and English translation).
Office Action dated Feb. 12, 2010 from the German Patent Office in the corresponding patent application No. 103 34 819.0 (and English translation).
N. Nordell, et al., "Homoepitaxy of 6H and 4H SiC on nonplanar substrates," Appl. Phys. Lett. 72(2): 197-199, Jan. 12, 1998.
N. Nordell, et al., "Equilibrium crystal shapes for 6H and 4H SiC grown on non-planar substrates," Materials Science and Engineering, B61-62:130-134, 1999.
Office Action mailed Feb. 9, 2011 issued from the German Patent Office in corresponding De patent application No. 103 34 819.0-33 (English translation enclosed).

*Primary Examiner* — Long Pham
(74) *Attorney, Agent, or Firm* — Posz Law Group, PLC

(57) ABSTRACT

A silicon carbide (SiC) substrate is provided with an off-oriented {0001} surface whose off-axis direction is <11-20>. A trench is formed on the SiC to have a stripe structure extending toward a <11-20> direction. An SiC epitaxial layer is formed on an inside surface of the trench.

9 Claims, 17 Drawing Sheets

SILICON CARBIDE SEMICONDUCTOR DEVICE

Matter enclosed in heavy brackets [ ] appears in the original patent but forms no part of this reissue specification; matter printed in italics indicates the additions made by reissue.

CROSS REFERENCE TO RELATED APPLICATIONS

This application is based on and incorporates herein by reference Japanese Patent Application No. 2002-233722 filed on Aug. 9, 2002.

FIELD OF THE INVENTION

The present invention relates to silicon carbide (SiC) semiconductor device where a facet is hindered from occurring.

BACKGROUND OF THE INVENTION

In JP-A-H9-172187 discloses a structure of a silicon carbide (SiC) substrate 200 having a trench 201, wherein a silicon carbide epitaxial layer 202 is formed on an inside surface of the trench 200. Here, in order that electric field is inhibited from being concentrated on side walls of the trench 201, the substrate 200 has a main surface of a (0001) plane and the trench 201 has side walls of a (1-100) plane, as shown in FIG. 28.

In actual manufacturing, as shown in FIGS. 29A, 29B, when the epitaxial layer 202 grows from the (1-100) planes within the trench 201, a facet is formed in a vicinity of the surface. A defect cannot thereby be prevented. Namely, imbedded epitaxial growth on a wafer having an off-axis of a <1-100> direction develops the (0001) facet downstream of the <1-100> direction. This exhibits an asymmetric cross sectional shape of the epitaxial layer 202 that is deposited within the trench 201, and causes the facet to have a rugged surface, resulting in being apt to develop a defect on the facet.

When the above substrate is applied to a trench JFET, or a trench MOSFET, a facet is formed on a channel layer. This increases on-resistance due to lowered mobility and leak electric current, or varies a threshold value.

Incidentally, (1-100) or <1-100> is equivalent to $(0\bar{1}00)$ or $<0\bar{1}00>$ that is usually described in an expression method for a crystallographic plane or direction. Namely, "–n" in an index reads "$\bar{n}$."

SUMMARY OF THE INVENTION

It is an object of the present invention to restrict formation of a facet when an epitaxial layer grows on an inside surface of a trench of a silicon carbide substrate.

To achieve the above object, a silicon carbide semiconductor device is provided with the following.

A silicon carbide substrate is provided as having an off-oriented {0001} surface whose off-axis direction is <11-20> or <1-100> and a trench is provided as having a stripe structure extending toward a <11-20> or <1-100> direction, respectively.

This structure restricts formation of a facet when an epitaxial layer grows on an inside surface of the trench.

Furthermore, to achieve the same object to thereby enable the same effect, other silicon carbide semiconductor devices are differently provided as follows.

Another silicon carbide semiconductor device is provided with a silicon carbide substrate that has an off-oriented {0001} surface whose off-axis direction is <11-20> or <1-100> and a trench that has a side wall of a {1-100} or {11-20} surface, respectively.

Another silicon carbide semiconductor device is provided with a silicon carbide substrate that has an off-oriented surface having a certain off-axis direction and a planar structure of a trench has sides, each of which is at an angle of 80 degrees or less, favorably at 75 degrees or less, with respect to the certain off-axis direction.

Another silicon carbide semiconductor device is provided with a silicon carbide substrate that has an off-oriented {0001} surface whose off-axis direction is <11-20> or <1-100> and a trench that has a side wall of {11-20} or {1-100} surface that is not perpendicular to the off-axis, respectively.

Yet another silicon carbide semiconductor device is provided with a silicon carbide substrate that is a hexagonal crystal silicon carbide substrate having a {11-20} or {1-100} main surface and a trench that has a side wall being slant at an angle of one degree or more with respect to a {0001} plane in a sectional structure.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS (First Embodiment)

A first embodiment will be explained with reference to FIGS. 1A to 1B. A silicon carbide (SiC) substrate (or wafer) 10 has a trench 11 on it. The SiC substrate 10 has a <11-20> off-oriented {0001} surface, which is a {0001} surface having an off angle and an off-axis direction of <11-20>. The trench 11 has a stripe structure extending toward a <11-20> direction. As shown in FIG. 2, within an inside surface of the trench 11, an SiC epitaxial layer 12 is formed. In detail, the SiC epitaxial layer 12 is formed on the SiC substrate 10 including the inside surface of the trench 11.

On the <11-20> off-oriented SiC wafer 10, the trench 11 is thus formed as having the stripe structure extending towards the <11-20> direction, and the SiC layer 12 is formed on the SiC substrate 10 including the inside of the trench 11.

Figure 2:
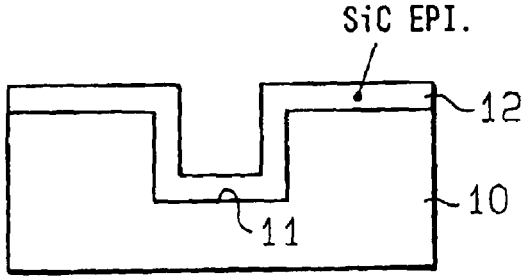
FIG. 2 is a longitudinal sectional view of the SiC semiconductor device according to the first embodiment.
Figure 3:
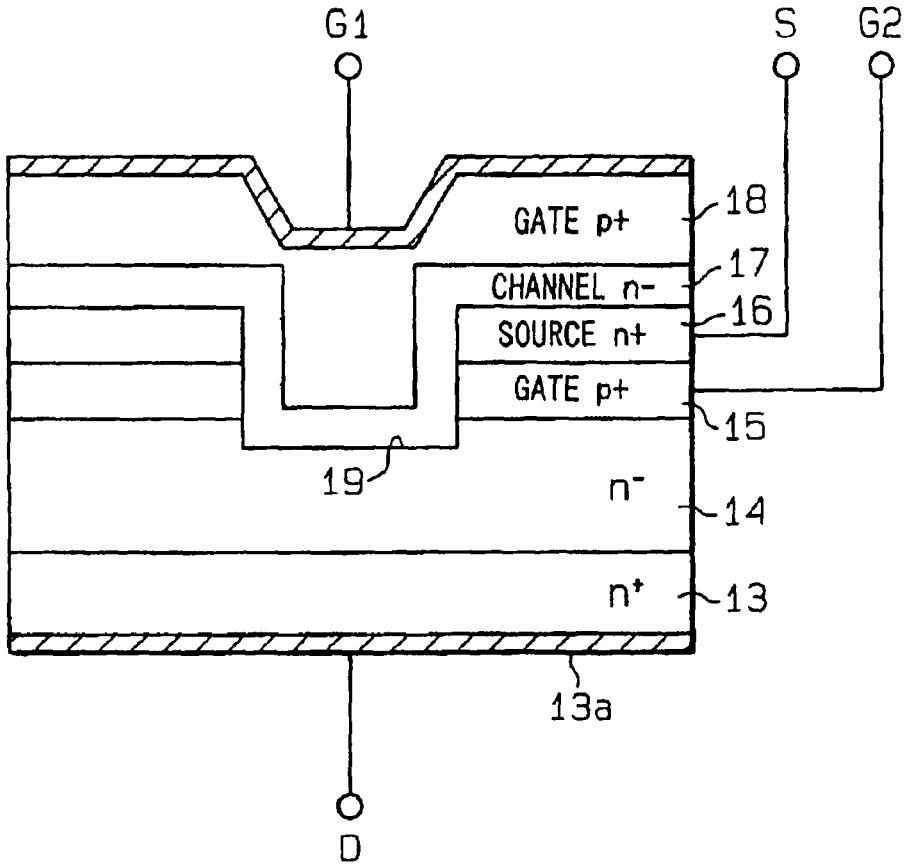
FIG. 3 is a longitudinal sectional view of a trench JFET.

Therefore, when the epitaxial layer 12 grows within the trench 11, no facet is formed on the (1-100) side wall of the trench 11. Preventing formation of the facet enables the (1-100) plane to be a channel layer. This is favorable for being applied to a trench JFET shown in FIG. 3. In detail, on an $n^+$ SiC substrate 13, an $n^-$ epitaxial layer 14, a gate $p^+$ epitaxial layer 15, a source $n^+$ epitaxial layer 16 are previously formed in order, and a trench 19 is then formed on the upper surface of the preceding layers. The trench 19 penetrates through the source $n^+$ epitaxial layer 16 and the gate $p^+$ epitaxial layer 15 to reach the $n^-$ epitaxial layer 14. Within the trench 19, a channel $n^-$ epitaxial layer 17 and a gate $p^+$ epitaxial layer 18 are formed. On the $n^+$ SiC substrate 13, a drain electrode 13a is formed as a back electrode. The first gate voltage is applied to the gate $p^+$ epitaxial layer 18, while the second gate voltage is applied to the gate $p^+$ epitaxial layer 15. Adjusting a voltage between the gate $p^+$ epitaxial layer 18 and the gate $p^+$ epitaxial layer 15 leads to controlling expansion of a depletion layer in the channel $n^-$ epitaxial layer 17 between the gate $p^+$ epitaxial layer 18 and the gate $p^+$ epitaxial layer 15. This results in enabling controlling an electric current that flows between the source and the drain (between the source $n^+$ epitaxial layer 16 and the $n^+$ SiC substrate 13). Here, as explained in FIGS. 1A, 1B, 2, the (1-100) plane can be the channel layer.

Figure 4:
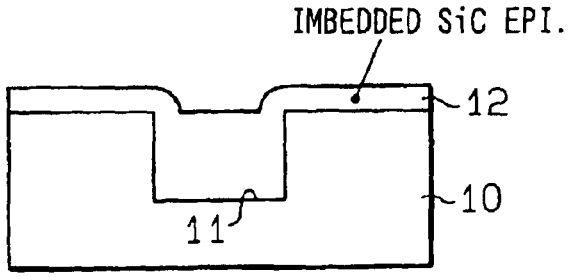
FIG. 4 is a longitudinal sectional view of the SiC semiconductor device according to the first embodiment.

In addition, as shown in FIG. 4, the trench 11 can be imbedded with an epitaxial layer 12 (imbedded epitaxial layer 12) as substitution of the epitaxial layer 12 shown in FIG. 2.

As described above, using an off-oriented wafer 10, a trench 11 has a stripe structure extending toward an off-axis direction along a line L1 of FIG. 1, and an epitaxial layer 12 is then formed on the surface of the wafer 10 including inside surfaces of the trench 11. Since no facet is thereby formed when an epitaxial layer 12 grows, side walls of the trench 11 can be base surfaces for a channel layer.

(Second Embodiment)

Figure 5A:
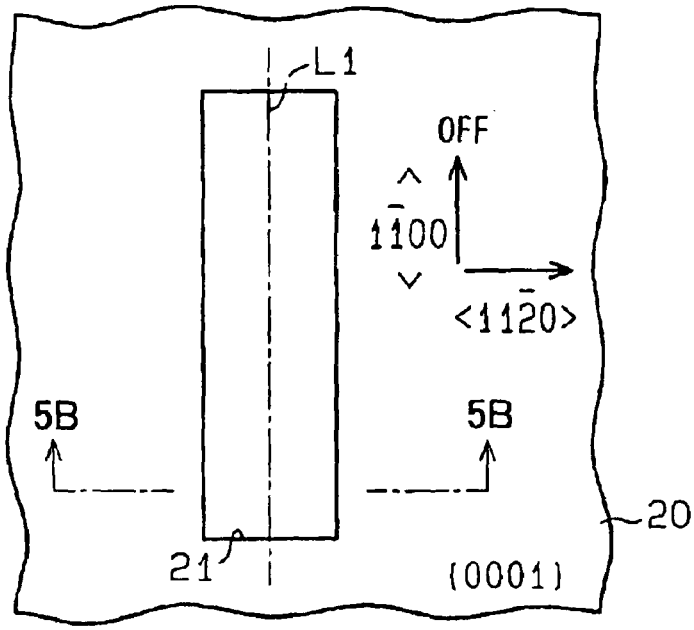
FIG. 5A is a plan view for explaining an SiC semiconductor device according to a second embodiment.
Figure 5B:
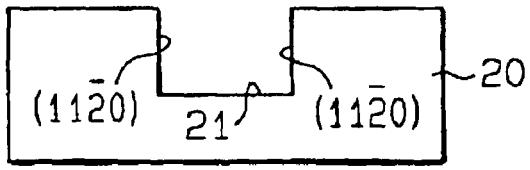
FIG. 5B is a longitudinal sectional view taken along line 5B-5B.
Figure 6:
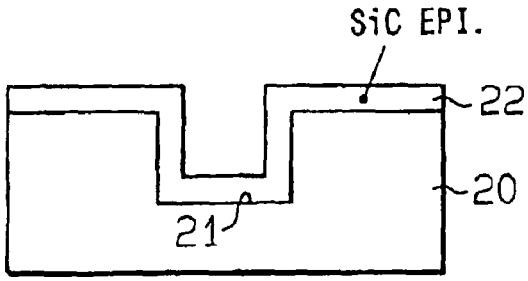
FIG. 6 is a longitudinal sectional view of the SiC semiconductor device according to the second embodiment.

A second embodiment is different from the first embodiment in an off-axis direction and an extending direction of a trench. Referring to FIGS. 5A, 5B, 6, the second embodiment will be explained below.

An SiC substrate 20 has a <1-100> off-oriented {0001} surface. A trench 21 has a stripe structure extending toward a <1-100> direction.

On the <1-100> off-oriented SiC wafer 20, the trench 21 is thus formed as having the stripe structure extending towards the <1-100> direction, and an SiC layer 22 is formed on the SiC substrate 20 including the inside of the trench 21.

Therefore, when the epitaxial layer 22 grows within the trench 21, no facet is formed on (11-20) side walls of the trench 21. Preventing formation of the facet enables the (11-20) plane to be a channel layer.

In other words, selecting a <1-100> direction as an off-axis prevents a facet from being formed on a (11-20) plane having high mobility. This results in being favorable in forming a channel layer for an FET.

Figure 7:
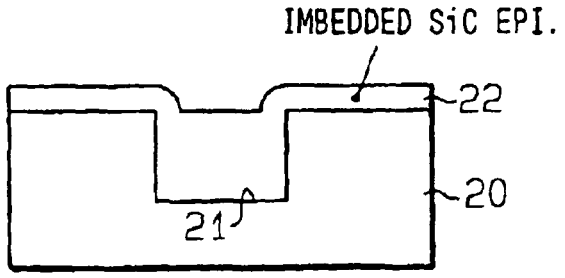
FIG. 7 is a longitudinal sectional view of the SiC semiconductor device according to the second embodiment.

In addition, as shown in FIG. 7, the trench 21 can be imbedded with an epitaxial layer 22 (imbedded epitaxial layer 22) as substitution of the epitaxial layer 22 shown in FIG. 6.

(Third Embodiment)

Figure 8A:
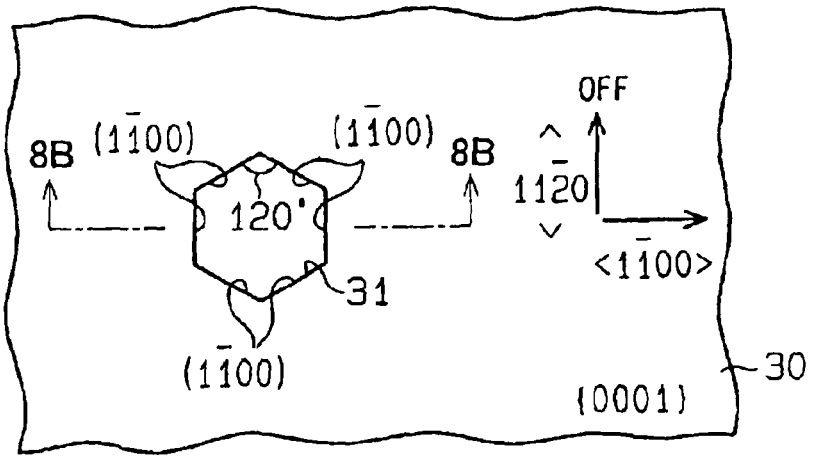
FIG. 8A is a plan view for explaining an SiC semiconductor device according to a third embodiment.
Figure 8B:
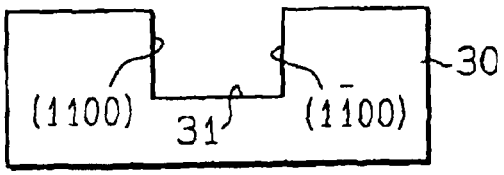
FIG. 8B is a longitudinal sectional view taken along line 8B-8B.
Figure 9:
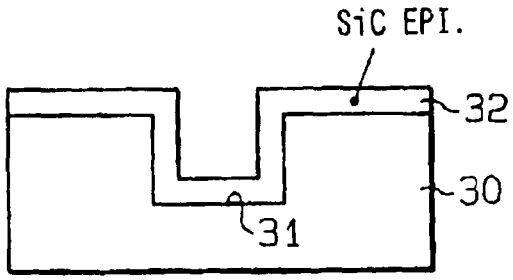
FIG. 9 is a longitudinal sectional view of the SiC semiconductor device according to the third embodiment.

A third embodiment is different from the first embodiment in a planar structure of a trench. Referring to FIGS. 8A, 8B, 9, the third embodiment will be explained below.

An SiC substrate 30 has a <11-20> off-oriented {0001} surface. A trench 31 has a regular hexagonal planar structure and side walls of a (1-100) plane, as shown in FIG. 8A. An SiC layer 32 is formed on the SiC substrate 30 including the inside of the trench 31, as shown in FIG. 9.

Therefore, when the epitaxial layer 32 grows within the trench 31, no facet is formed on (1-100) side walls of the trench 31. Preventing formation of the facet enables the (1-100) plane to be a channel layer.

Furthermore, a trench 31 can be formed as having a long hexagonal planar structure instead of the regular hexagonal planar structure, like a stripe structure. The stripe structure has a pair of two longitudinal sides that parallelly face to each other and two pairs of two short sides that form two triangular terminal ends. Here, each triangular terminal end is formed of two (1-100) planes that intersect to each other with an angle of 120 degrees. No facet is thereby formed also in the terminal ends of the trench 31. This enables the terminal ends of the trench 31, along with the longitudinal sides of the trench 31, to be also used as a channel layer.

A first modification of the third embodiment will be explained with reference to FIGS. 10A, 10B.

An SiC substrate 30 has a <11-20> off-oriented {0001} surface. A trench 33 has a regular triangular planar structure and side walls of a (1-100) plane, as shown in FIGS. 10A, 10B. An SiC layer (not shown) is formed on the SiC substrate 30 including the inside of the trench 33. When the epitaxial layer grows within the trench 33, no facet is formed on (1-100) side walls of the trench 31. Preventing formation of the facet enables the (1-100) plane to be a channel layer.

A second modification of the third embodiment will be explained with reference to FIGS. 11A, 11B, 12.

Figure 10A:
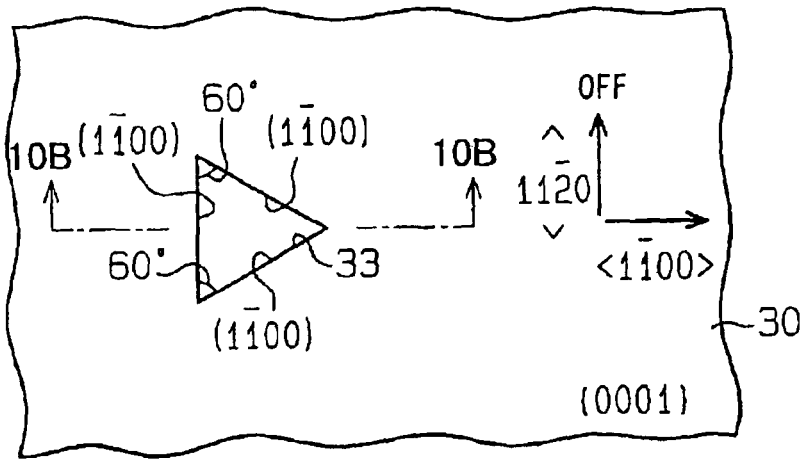
FIG. 10A is a plan view for explaining a first modification of the SiC semiconductor device according to the third embodiment.
Figure 10B:
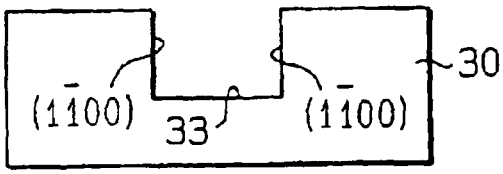
FIG. 10B is a longitudinal sectional view taken along line 10B-10B.
Figure 11A:
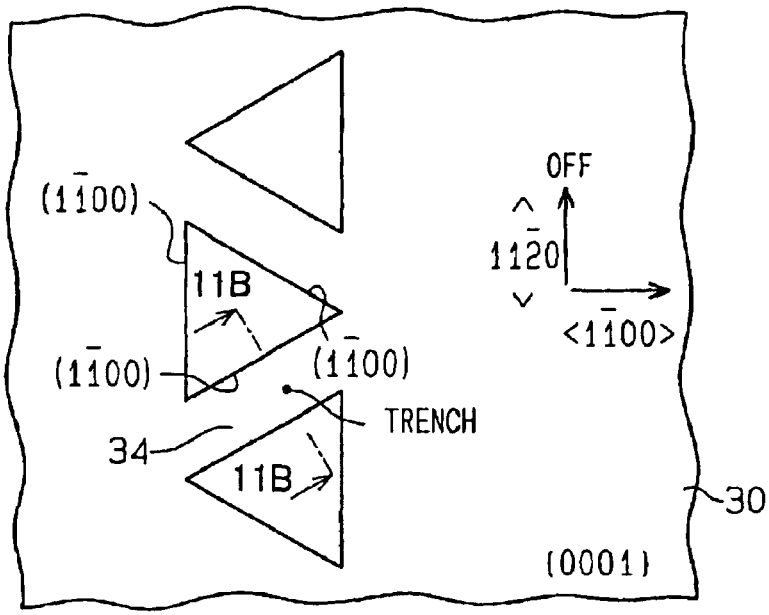
FIG. 11A is a plan view for explaining a second modification of the SiC semiconductor device according to the third embodiment.
Figure 11B:
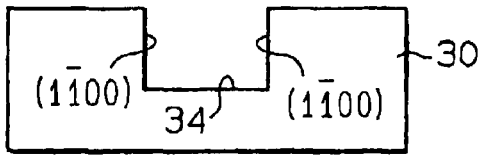
FIG. 11B is a longitudinal sectional view taken along line 11B-11B.
Figure 12:
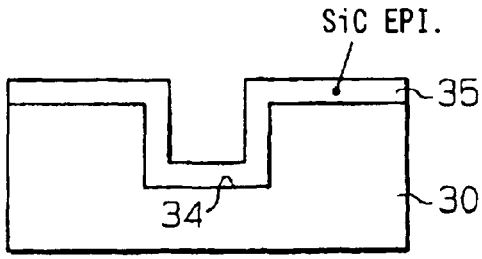
FIG. 12 is a longitudinal sectional view of the second modification of the SiC semiconductor device according to the third embodiment.

Relationship, shown in FIG. 10A, between the substrate 30 and trench 33 is reversed in FIGS. 11A, 11B. Namely, an SiC substrate 30 has a <11-20> off-oriented {0001} surface and a trench 34 having side walls of a (1-100) plane is formed between regular triangles, as shown in FIGS. 11A, 11B. An SiC layer 35 is formed on the SiC substrate 30 including the inside of the trench 34. When the epitaxial layer 35 grows within the trench 34, no facet is formed on (1-100) side walls of the trench 34. Preventing formation of the facet enables the (1-100) plane to be a channel layer.

Figure 13A:
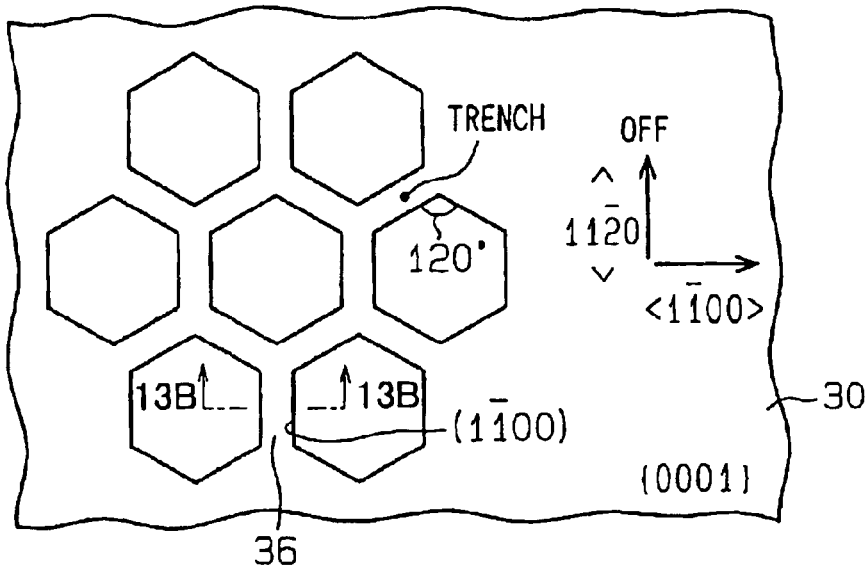
FIG. 13A is a plan view for explaining another modification of the SiC semiconductor device according to the third embodiment.
Figure 13B:
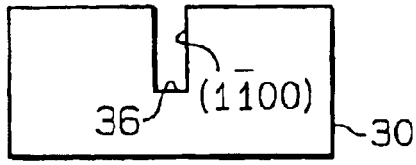
FIG. 13B is a longitudinal sectional view taken along line 13B-13B.

Furthermore, relationship, shown in FIG. 8A, between the substrate 30 and trench 31 is reversed in FIGS. 13A, 13B. Namely, a trench 36 having side walls of a (1-100) plane is formed between hexagons, as shown in FIGS. 13A, 13B.

(Fourth Embodiment)

Figure 14A:
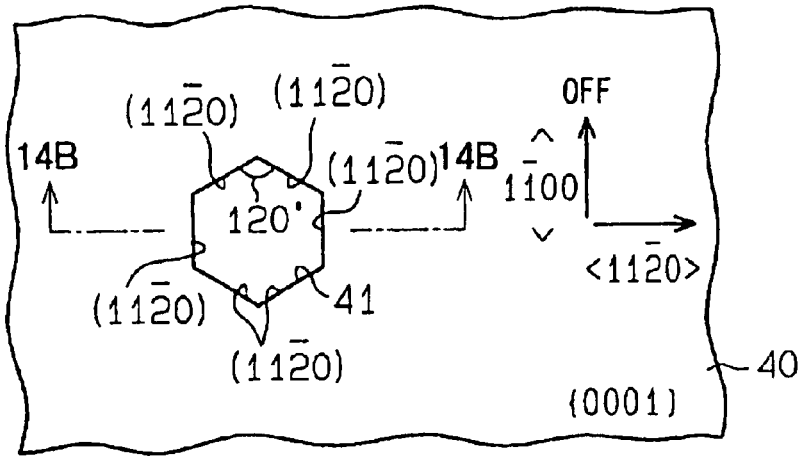
FIG. 14A is a plan view for explaining an SiC semiconductor device according to a fourth embodiment.
Figure 14B:
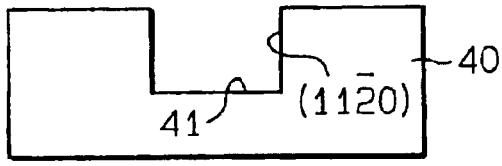
FIG. 14B is a longitudinal sectional view taken along line 14B-14B.
Figure 15:
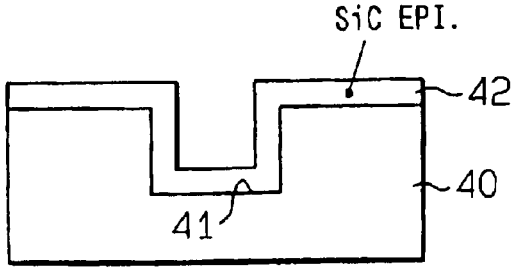
FIG. 15 is a longitudinal sectional view of the SiC semiconductor device according to the fourth embodiment.

A fourth embodiment is different from the third embodiment shown in FIG. 8A in an off-axis direction of a substrate and a plane index of side walls of a trench. Referring to FIGS. 14A, 14B, 15, the fourth embodiment will be explained below.

An SiC substrate 40 has a <1-100> off-oriented {0001} surface. A trench 41 has a regular hexagonal planar structure and side walls of a (11-20) plane, as shown in FIG. 14A. An SiC layer 42 is formed on the SiC substrate 40 including the inside of the trench 41, as shown in FIG. 15.

Therefore, when the epitaxial layer 42 grows within the trench 41, no facet is formed on (11-20) side walls of the trench 41. Preventing formation of the facet enables the (11-20) plane to be a channel layer.

Furthermore, a trench 41 can be formed as having a long hexagonal planar structure instead of the regular hexagonal planar structure, like a stripe structure. The stripe structure has a pair of two longitudinal sides that parallelly face to each other and two pairs of two short sides that form two triangular terminal ends. Here, each triangular terminal end is formed of two (11-20) planes that intersect to each other with an angle of 120 degrees. No facet is thereby formed also in the terminal ends of the trench 41. This enables the terminal ends of the trench 41, along with the longitudinal sides of the trench 41, to be also used as a channel layer.

Figure 16A:
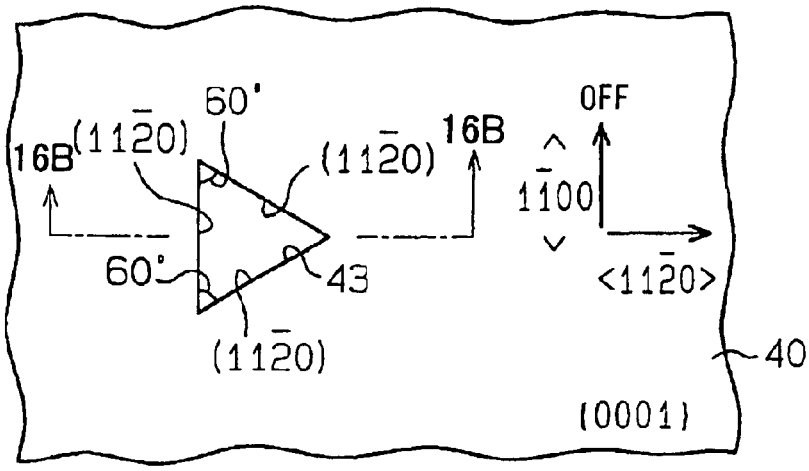
FIG. 16A is a plan view for explaining a modification of the SiC semiconductor device according to the fourth embodiment.
Figure 16B:
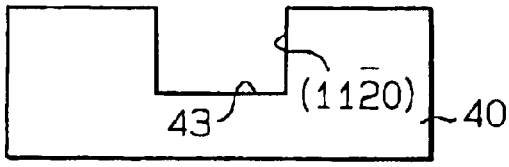
FIG. 16B is a longitudinal sectional view taken along line 16B-16B.
Figure 17A:
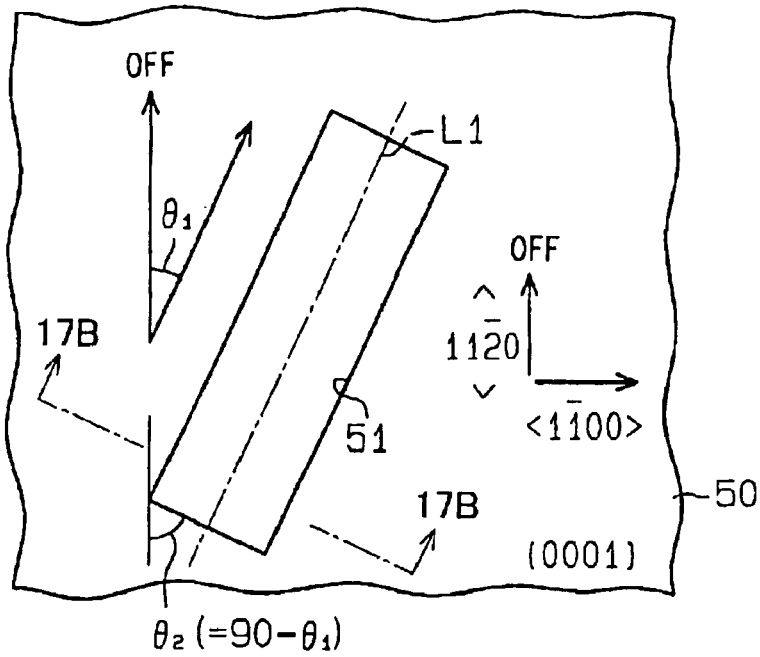
FIG. 17A is a plan view for explaining an SiC semiconductor device according to a fifth embodiment.
Figure 17B:
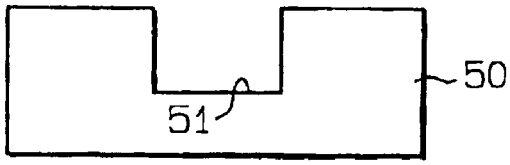
FIG. 17B is a longitudinal sectional view taken along line 17B-17B.

A modification of the fourth embodiment will be explained with reference to FIGS. 16A, 16B.

An SiC substrate 40 has a <1-100> off-oriented {0001} surface. A trench 43 has a regular triangular planar structure and side walls of a (11-20) plane. An SiC layer (not shown) is formed on the SiC substrate 40 including the inside of the trench 43. When the epitaxial layer grows within the trench 43, no facet is formed on (11-20) side walls of the trench 43. Preventing formation of the facet enables the (11-20) plane to be a channel layer.

(Fifth Embodiment)

A fifth embodiment will be explained mainly in difference from the first embodiment shown in FIGS. 1A, 1B, with reference to FIGS. 17A, 17B, 18, 19.

An SiC substrate 50 has a <11-20> off-oriented {0001} surface, which is a {0001} surface having an off angle and an off-axis direction of <11-20>. A trench 51 has a planar structure of a rectangle. Each side of the rectangle is at an angle of 80 degrees or less, favorably 75 degrees or less, with respect to the off-axis direction. In detail, the longitudinal sides of the rectangle are at an angle $\theta_1$ with respect to the off-axis direction, while the lateral sides are at an angle $\theta_2$ (acute angle: $\theta_2=90-\theta_1$) with respect to the off-axis direction. Here, both the angles $\theta_1$, $\theta_2$ are 80 degrees or less, favorably 75 degrees or less.

Figure 18:
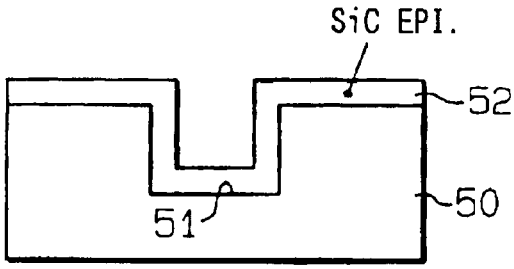
FIG. 18 is a longitudinal sectional view of the SiC semiconductor device according to the fifth embodiment.

On the off-oriented SiC wafer 50, the trench 51 is thus formed as having the sides at an angle of 80 degrees or less, favorably 75 degrees or less, with respect to the off-axis direction. An SiC layer 52 is then formed on the SiC substrate 50 including the inside of the trench 51, as shown in FIG. 18.

Here, whether a facet is formed on the side walls of the trench 51 when an epitaxial layer grows within the trench 51 depends on an angle $\theta$ between the off-axis and each of the sides of the trench 51. If the angle $\theta$ is 75 degrees or less, no facet is formed.

Figure 19:
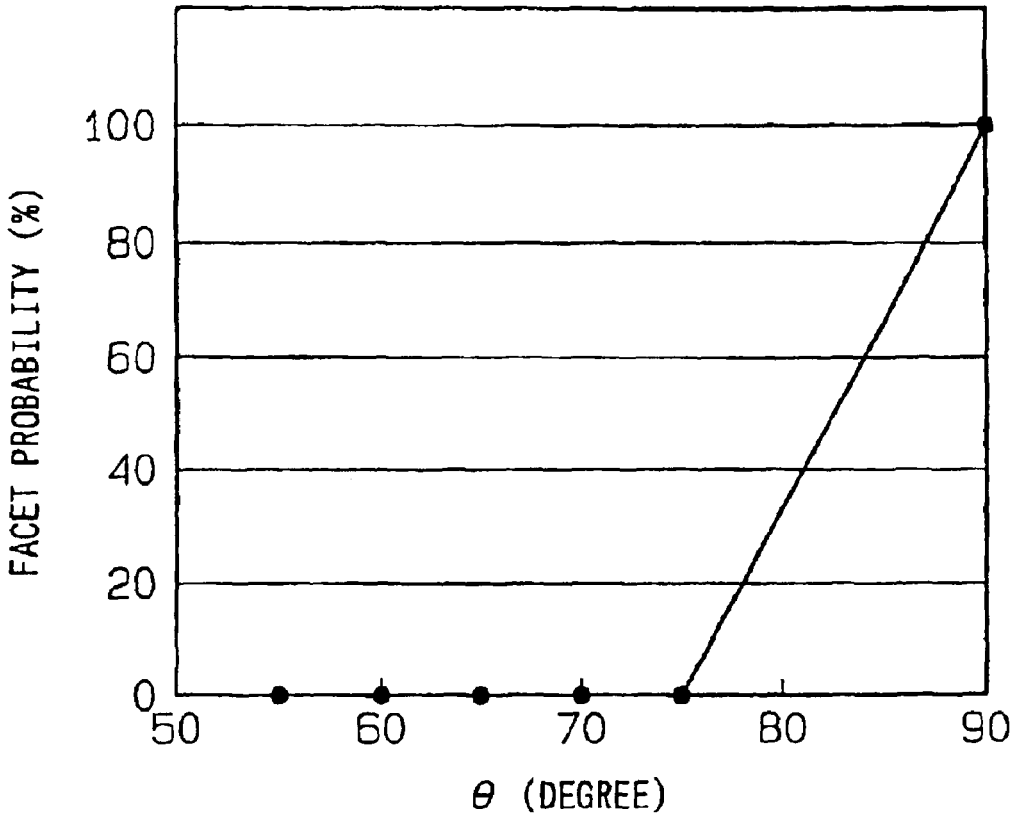
FIG. 19 is a graph showing occurrence probability of a facet.

FIG. 19 shows a measured result of formation probability of the facet based on the angle $\theta$. When the angle $\theta$ is 90 degrees, formation probability of the facet is 100%. By contrast, when the angle $\theta$ is 75 degrees or less, formation probability of the facet is 0%.

This indicates that all the sides of the planar structure of the trench 51 should be at an angle of 80 degrees or less, favorably 75 degrees or less, with respect to the off-axis of the SiC substrate 50.

(Sixth Embodiment)

Figure 20A:
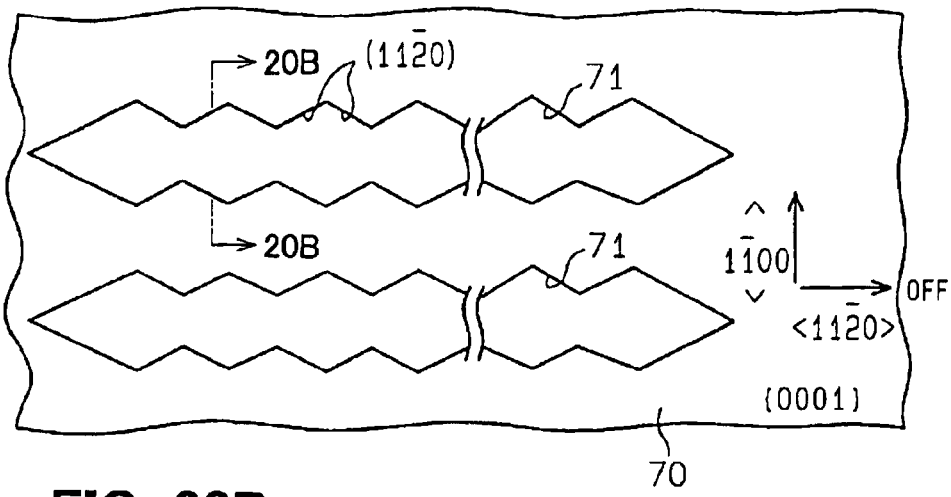
FIG. 20A is a plan view for explaining an SiC semiconductor device according to a sixth embodiment.
Figure 20B:
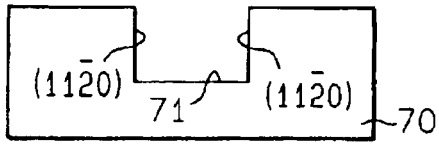
FIG. 20B is a longitudinal sectional view taken along line 20B-20B.

A sixth embodiment will be explained mainly in difference from the first embodiment shown in FIGS. 1A, 1B, with reference to FIGS. 20A, 20B.

An SiC substrate 70 has a {0001} surface having an off angle and an off-axis direction of <11-20>. A trench 71 has side walls, each of which is a (11-20) plane and not perpendicular to the off-axis of the SiC substrate 70, as shown in FIG. 20A. Pairs of mutually facing side walls come alternately near and away along an extending direction of the trench 71.

On the <11-20> off-oriented SiC wafer 70, the trench 71 is thus formed as having the side walls of (11-20) that include no (11-20) planes perpendicular to the off-axis of the substrate 70. Therefore, when an epitaxial layer (not shown) grows within the trench 71, no facet is formed. When this structure is applied to a device where the side walls of the trench is used as a channel layer, the (11-20) planes of the side walls become the channel layer, which enables obtaining high channel mobility.

Figure 1A:
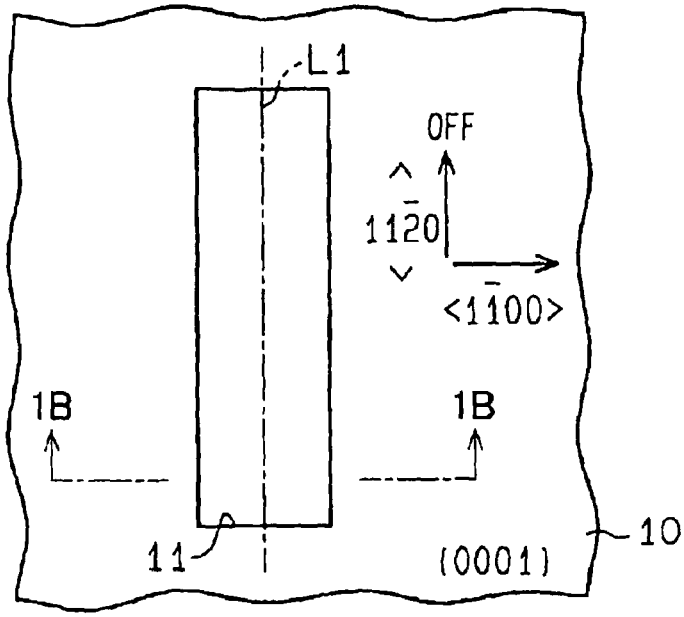
FIG. 1A is a plan view for explaining an SiC semiconductor device according to a first embodiment of the present invention.
Figure 1B:
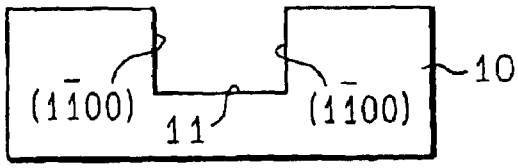
FIG. 1B is a longitudinal sectional view taken along line 1B-1B.

Furthermore, in comparison with the trench having the stripe structure linearly extending as shown in FIG. 1A, the trench 71 of this embodiment enables a greater channel width to thereby circulate a large electric current.

Figure 21:
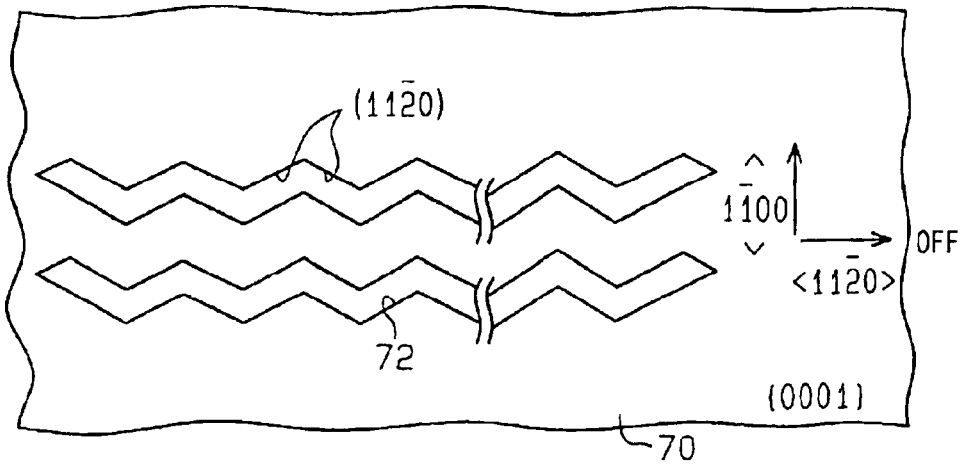
FIG. 21 is a plan view for explaining a modification of the SiC semiconductor device according to the sixth embodiment.

As a modification of the sixth embodiment, a trench 72 shown in FIG. 21 can be formed. The trench 72, which also have side walls of a (11-20) plane, has a constant width along an extending direction of itself.

(Seventh Embodiment)

Figure 22A:
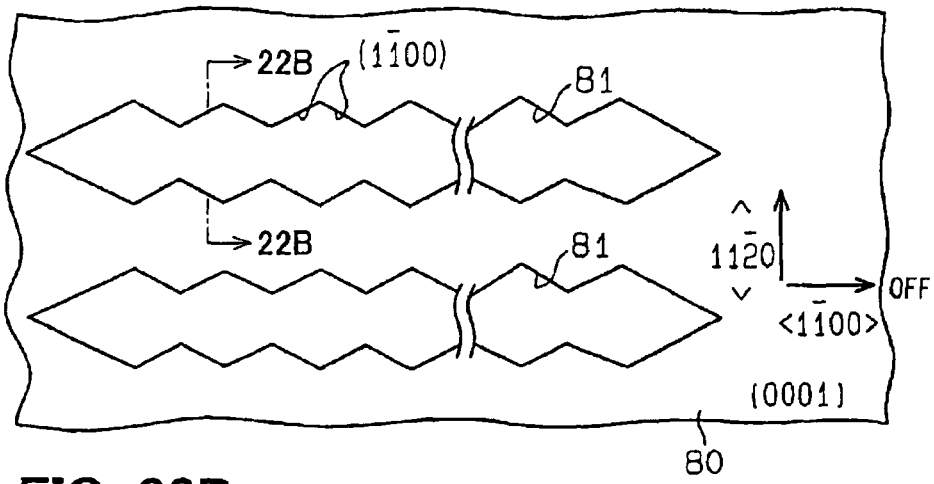
FIG. 22A is a plan view for explaining an SiC semiconductor device according to a seventh embodiment.
Figure 22B:
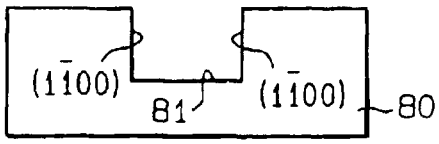
FIG. 22B is a longitudinal sectional view taken along line 22B-22B.

A seventh embodiment is different from the sixth embodiment in an off-axis direction of an SiC substrate and a plane index of side walls of a trench. Referring to FIGS. 22A, 22B, the second embodiment will be explained below.

An SiC substrate 80 has a {0001} surface having an off angle and an off-axis direction of <1-100>. A trench 81 has side walls, each of which is a (1-100) plane and not perpendicular to the off-axis of the SiC substrate 80, as shown in FIG. 22A. Pairs of mutually facing side walls come alternately near and away along an extending direction of the trench 81.

On the <1-100> off-oriented SiC wafer 80, the trench 81 is thus formed as having the side walls of (1-100) that include no (1-100) planes perpendicular to the off-axis of the substrate 80. Therefore, when an epitaxial layer (not shown) grows within the trench 81, no facet is formed. When this structure is applied to a device where the side walls of the trench is used as a channel layer, the (1-100) planes of the side walls become the channel layer, which enables obtaining high channel mobility.

Furthermore, in comparison with the trench having the stripe structure linearly extending as shown in FIG. 1A, the trench 81 of this embodiment enables a greater channel width to thereby circulate a large electric current.

Figure 23:
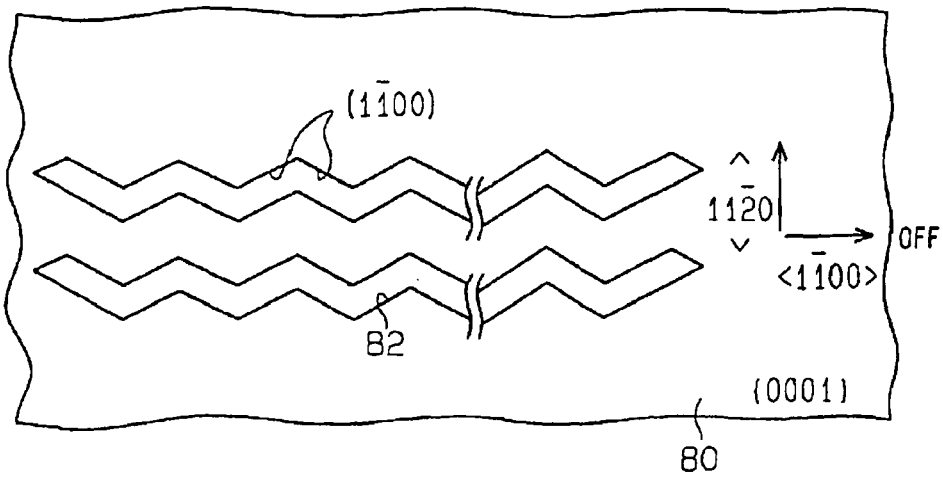
FIG. 23 is a plan view for explaining a modification of the SiC semiconductor device according to the seventh embodiment.

As a modification of the sixth embodiment, a trench 82 shown in FIG. 23 can be formed. The trench 82, which also have side walls of a (1-100) plane, has a constant width along an extending direction of itself.

(Eighth Embodiment)

An eight embodiment is different from the preceding embodiments in using an SiC substrate having no off angle.

Figure 24A:
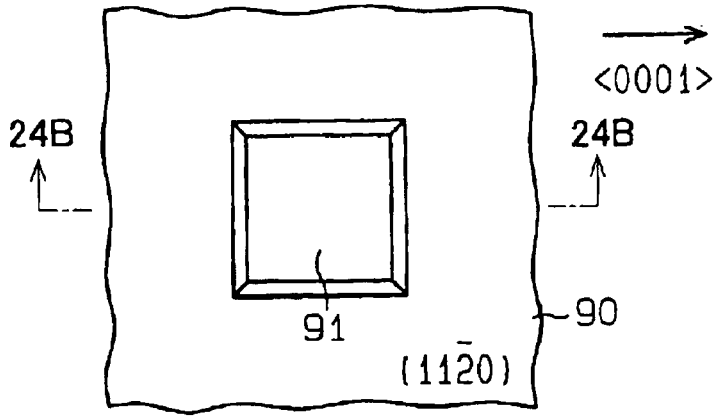
FIG. 24A is a plan view for explaining an SiC semiconductor device according to an eighth embodiment.
Figure 24B:
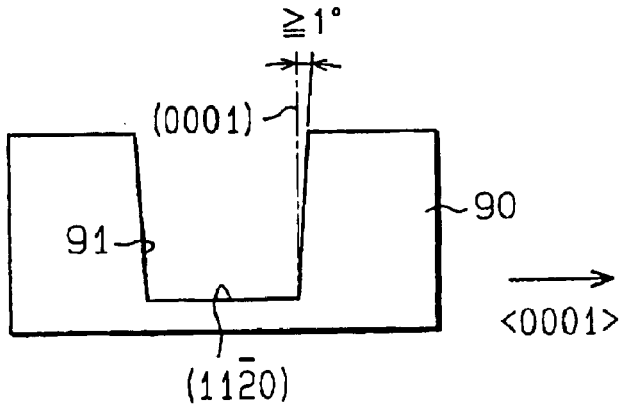
FIG. 24B is a longitudinal sectional view taken along line 24B-24B.
Figure 25:
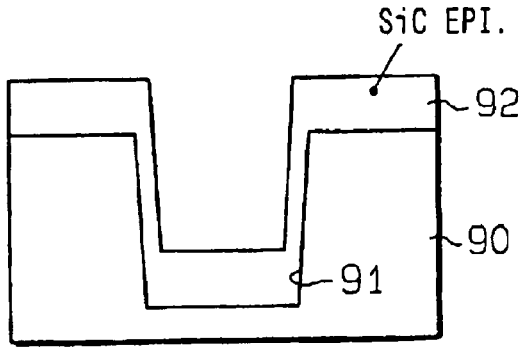
FIG. 25 is a longitudinal sectional view of the SiC semiconductor device according to the eighth embodiment.

As shown in FIGS. 24A, 24B, an SiC substrate 90 is a hexagonal crystal SiC substrate having a {11-20} main surface without an off angle. A trench 91 has side walls that are slant with being at an angle of one degree or more with respect to a (0001) plane in a sectional shape. Here, in this structure, when an epitaxial layer 92 grows within the trench 91, no facet is formed. Furthermore, when this structure is applied to a device where the side walls of the trench is used as a channel layer, the (0001) planes of the side walls become the channel layers, which enables obtaining high channel mobility.

(Ninth Embodiment)

Figure 26A:
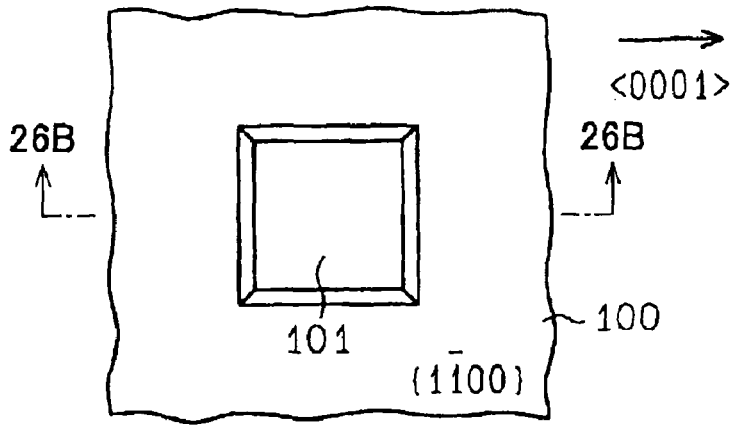
FIG. 26A is a plan view for explaining an SiC semiconductor device according to a ninth embodiment.
Figure 26B:
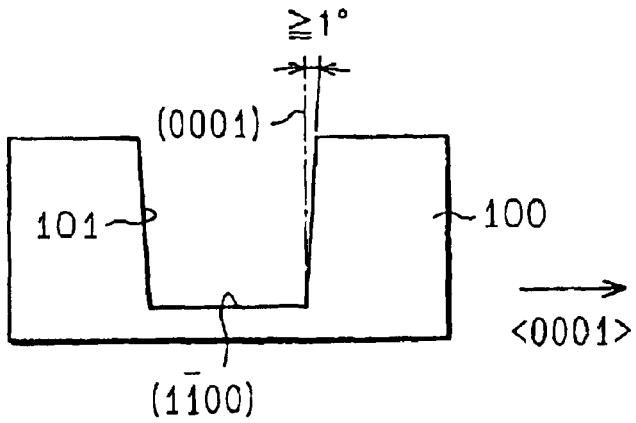
FIG. 26B is a longitudinal sectional view taken along line 26B-26B.
Figure 27:
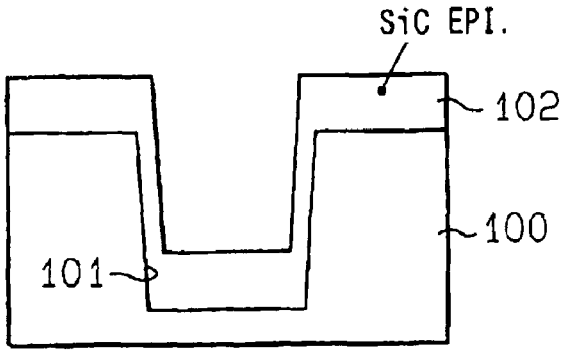
FIG. 27 is a longitudinal sectional view of the SiC semiconductor device according to the ninth embodiment.
Figure 28:
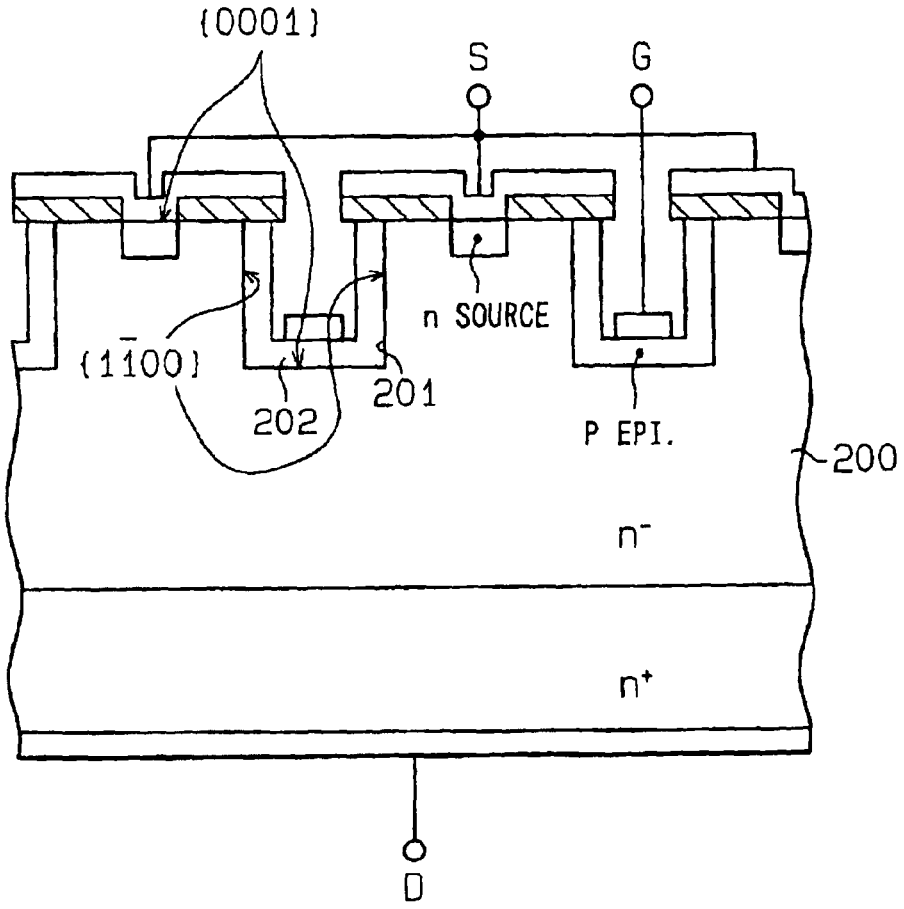
FIG. 28 RELATED ART
FIG. 28 is a longitudinal sectional view of an SiC semiconductor device of a related art.
Figure 29A:
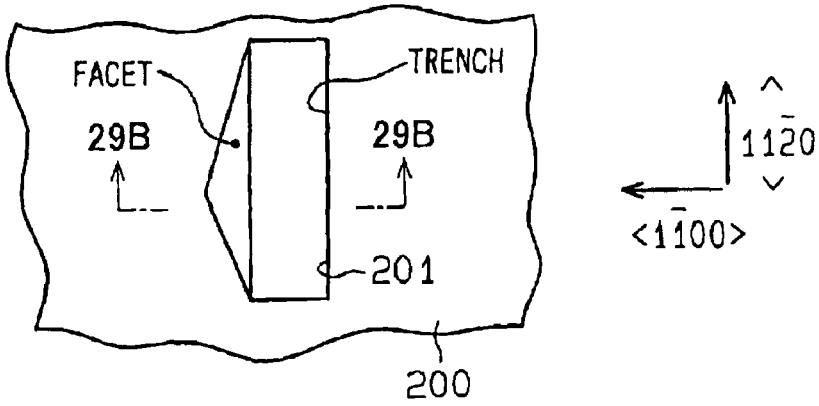
FIG. 29A RELATED ART
FIG. 29A is a plan view for explaining the SiC semiconductor device of the related art.
Figure 29B:
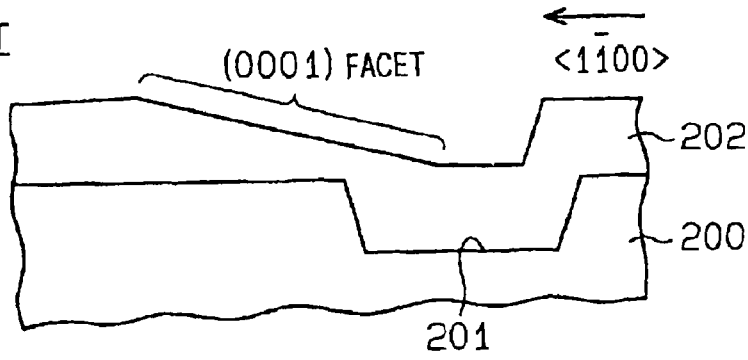
FIG. 29B RELATED ART
FIG. 29B is a longitudinal sectional view taken along line 29B-29B.

A ninth embodiment is different from the eighth embodiment in a plane index of a main surface of an SiC substrate. Referring to FIGS. 26A, 27B, the ninth embodiment will be explained below.

An SiC substrate 100 is a hexagonal crystal SiC substrate having a {1-100} main surface without an off angle. A trench 101 has side walls that are slant with being at an angle of one degree or more with respect to a (0001) plane in a sectional shape. Here, in the above structure, when an epitaxial layer 102 grows within the trench 101, no facet is formed. Furthermore, when this structure is applied to a device where the side walls of the trench is used as a channel layer, the (0001) planes of the side walls become the channel layers, which enables obtaining high channel mobility.

It will be obvious to those skilled in the art that various changes may be made in the above-described embodiments of the present invention. However, the scope of the present invention should be determined by the following claims.

What is claimed is:

[1. A silicon carbide semiconductor device comprising:

a silicon carbide substrate having a top surface that is a {0001} plane having an off angle, wherein an off-axis direction of the off angle is <11-20>; and a trench that is formed on the top surface of the silicon carbide substrate and has a stripe structure extending toward a <11-20> direction of the top surface of the silicon carbide substrate, wherein a silicon carbide epitaxial layer is formed on an inside surface of the trench.]

2. A silicon carbide semiconductor device comprising:

a silicon carbide substrate having a top surface that is a {0001} plane having an off angle, wherein an off-axis direction of the off angle is <1-100>; and a trench that is formed on the top surface of the silicon carbide substrate and has a stripe structure extending toward a <1-100> direction of the top surface of the silicon carbide substrate, wherein a silicon carbide epitaxial layer is formed on an inside surface of the trench.

3. A silicon carbide semiconductor device comprising:

a silicon carbide substrate having a top surface that is in a {0001} plane having an off angle, wherein an off-axis direction of the off angle is <11-20>; and a trench that is formed on the top surface of the silicon carbide substrate, wherein the trench has a side wall having a surface that is in a {1-1001} plane.

wherein a silicon carbide epitaxial layer is formed on an inside surface of the trench.

4. A silicon carbide semiconductor device comprising:

a silicon carbide substrate having a top surface that is in a {0001} plane having an off angle, wherein an off-axis direction of the off angle is <1-100>; and a trench that is formed on the top surface of the silicon carbide substrate, wherein the trench has a side wall having a surface that is in a {11-20} plane, wherein a silicon carbide epitaxial layer is formed on an inside surface of the trench.

5. A silicon carbide semiconductor device comprising:

a silicon carbide substrate having a top surface that is in a plane having an off angle, wherein an off-axis direction of the off angle is a certain direction; and a trench that is formed on the top surface of the silicon carbide substrate, wherein the trench has a planar structure, wherein each side of the planar structure is at an angle of 80 degrees or less with respect to the certain direction, wherein a silicon carbide epitaxial layer is formed on an inside surface of the trench.

6. A silicon carbide semiconductor device comprising:

a silicon carbide substrate having a top surface that is in a plane having an off angle, wherein an off-axis direction of the off angle is a certain direction; and a trench that is formed on the top surface of the silicon carbide substrate, wherein the trench has a planar structure, wherein each side of the planar structure is at an angle of 75 degrees or less with respect to the certain direction, wherein a silicon carbide epitaxial layer is formed on an inside surface of the trench.

7. A silicon carbide semiconductor device comprising:

a silicon carbide substrate having a top surface that is in a {0001} plane having an off angle, wherein an off-axis direction of the off angle is <11-20>; and a trench that is formed on the top surface of the silicon carbide substrate, wherein the trench has a side wall having a surface that is in a {11-20} plane and is not perpendicular to the off-axis direction, wherein a silicon carbide epitaxial layer is formed on an inside surface of the trench.

8. A silicon carbide semiconductor device comprising:

*a silicon carbide substrate having a top surface that is a {0001} plane having an off angle, wherein an off-axis direction of the off angle is <1-100>; and* a trench that is formed on the top surface of the silicon carbide substrate, wherein the trench has a side wall having a surface that is in a {1-100} plane and is not perpendicular to the off-axis direction, wherein a silicon carbide epitaxial layer is formed on an inside surface of the trench.

9. A silicon carbide semiconductor device comprising:

a silicon carbide substrate that is a hexagonal crystal silicon carbide substrate having a top surface that is in a {11-20} plane; and a trench that is formed on the top surface of the silicon carbide substrate, wherein the trench has a side wall that is inclined at an angle of one degree or more with respect to a {0001} plane in a virtual cross-sectional view that is perpendicular to the top surface of the silicon carbide substrate, wherein a silicon carbide epitaxial layer is formed on an inside surface of the trench.

10. A silicon carbide semiconductor device comprising:

a silicon carbide substrate being a hexagonal crystal silicon carbide substrate having a top surface that is in a {1-100} [lane] *plane*; and a trench that is formed on the top surface of the silicon carbide substrate and has a side wall that is inclined at an angle of one degree or more with respect to a {0001} plane in a virtual cross-sectional view that is perpendicular to the top surface of the silicon carbide substrate, wherein a silicon carbide epitaxial layer is formed on an inside surface of the trench.

* * * * *